United States Patent
Thomas

(10) Patent No.: US 6,775,175 B2
(45) Date of Patent: Aug. 10, 2004

(54) BLOWABLE MEMORY DEVICE AND METHOD OF BLOWING SUCH A MEMORY

(75) Inventor: Sigrid Thomas, Grenoble (FR)

(73) Assignee: STMicroelectronics SA, Montrouge (FR)

(*) Notice: Subject to any disclaimer, the term of this patent is extended or adjusted under 35 U.S.C. 154(b) by 0 days.

(21) Appl. No.: 10/233,052

(22) Filed: Aug. 30, 2002

(65) Prior Publication Data

US 2003/0053349 A1 Mar. 20, 2003

(30) Foreign Application Priority Data

Sep. 5, 2001 (FR) .......................................... 01 11485

(51) Int. Cl.[7] .............................................. G11C 11/24
(52) U.S. Cl. ....................... 365/149; 365/96; 365/225.7
(58) Field of Search ....................... 365/96, 149, 225.7, 365/230.06, 104, 145

(56) References Cited

U.S. PATENT DOCUMENTS

| | | | |
|---|---|---|---|
| 4,419,743 A | * 12/1983 | Taguchi et al. ............. | 365/149 |
| 5,506,518 A | 4/1996 | Chiang ........................ | 326/41 |
| 5,675,547 A | 10/1997 | Koga ..................... | 365/230.03 |
| 5,724,282 A | * 3/1998 | Loughmiller et al. ......... | 365/96 |
| 5,969,983 A | * 10/1999 | Thakur et al. .............. | 365/149 |
| 6,115,283 A | * 9/2000 | Hidaka ....................... | 365/149 |

* cited by examiner

Primary Examiner—Son Mai
(74) Attorney, Agent, or Firm—Lisa K. Jorgenson; Allen, Dyer, Doppelt, Milbrath & Gilchrist, P.A.

(57) ABSTRACT

A memory device includes a plurality of memory cells arranged as a matrix. Each memory cell includes a transistor and a capacitor connected in series. Each memory cell is linked to a bit line that connects the memory cells of a column. Each memory cell is also linked to a word line and to a third line. A gate of the transistor of a memory cell is linked to the word line, with each word line being linked to the gates of the transistors in a respective column. A third line is linked to the sources of the transistors of a row of memory cells. A bit line is linked to the capacitors of the transistors of a column. The voltage between the gate and the source of a transistor can thus be controlled via the word column and the third line.

22 Claims, 4 Drawing Sheets

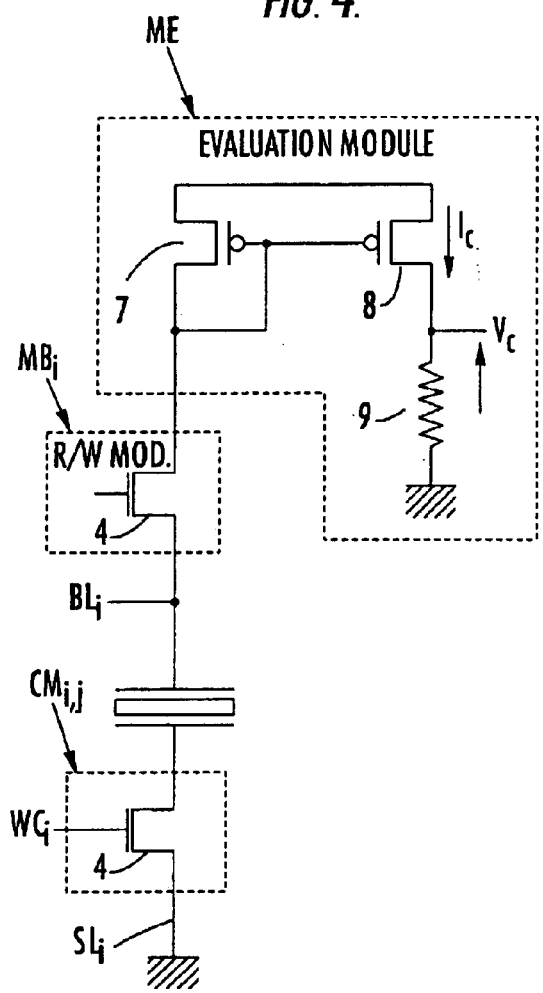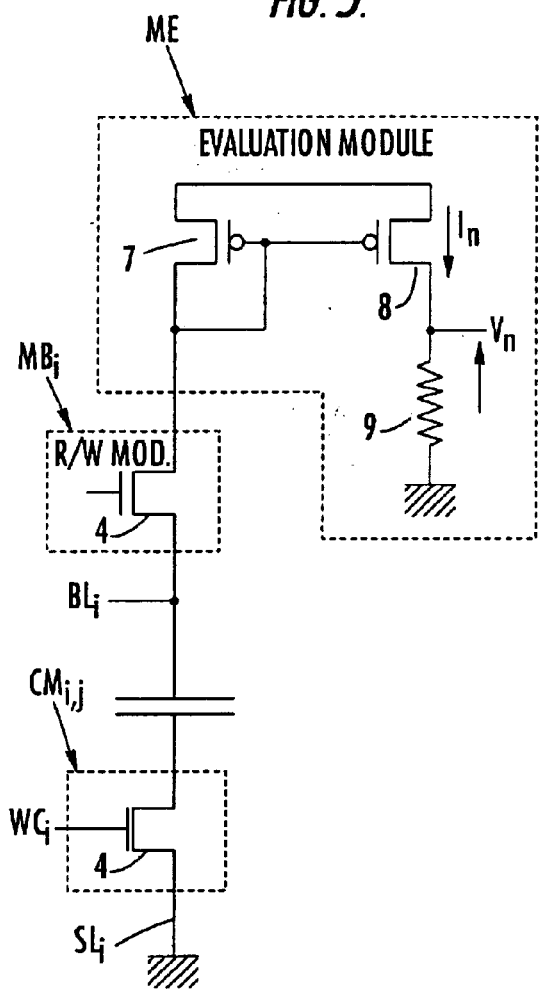

BLOWABLE MEMORY DEVICE AND METHOD OF BLOWING SUCH A MEMORY

FIELD OF THE INVENTION

The present invention relates to the field of electronics, and more particularly, to an integrated memory comprising a plurality of memory cells arranged as a matrix with row and column addressing.

BACKGROUND OF THE INVENTION

Reference may be made to the article "A Survey of Circuit Innovations in Ferroelectric Random-Access Memories" by Ali Sheikholeslami and P. Glenn Gulak, in Proceedings Of The IEEE, Vol. 88, No. 5, May 2000, which describes various types of memories. With reference to FIG. 23 of this article, a block diagram of a nonblowable, conventional ferroelectric memory comprising a matrix of memory cells is described therein.

The addressing is achieved via a column-wise bit line and a word line and a plate line per row. The word line of a row is arranged on one side of the memory cells of the row, while the plate line is arranged on the opposite side, adjacent to the word line of the next row. Each memory cell comprises a MOS transistor whose gate is linked to the word line, a drain linked to the bit line and a source linked to the capacitor. The other terminal of the capacitor is linked to the plate line.

In the field of blowable memories, one seeks to blow the capacitors of specified memory cells without harming the neighboring memory cells using a voltage greater than the normal operating voltage. By way of example, in a circuit whose normal operating voltage is 3.3 volts, a voltage of 6 volts is applied to one of the addressing lines, and the transistor of the memory cell to be blown is turned on. The other addressing line is set to 0 volts so that the capacitor experiences a voltage of 6 volts sufficient to blow it.

Stated otherwise, its characteristics are irretrievably modified. In known memories, the application of the blowing voltage results in excessive voltages across the terminals of the neighboring cells which could be damaged depending on the ratio of impedance between the capacitor and the transistor of each memory cell.

SUMMARY OF THE INVENTION

In view of the foregoing background, an object of the present invention is to provide a highly reliable blowable memory architecture so that the blowing of a memory cell does not negatively affect the other memory cells.

This and other objects, advantages and features according to the present invention are provided by a blowable memory device comprising a plurality of memory cells arranged as a matrix, with each memory cell comprising a transistor and a capacitor connected in series, and is linked to a bit line linked to the memory cells of a column, to a word line and to a third line. The gate of the transistor of a memory cell is linked to the word line. A third line is linked to the sources of the transistors of a row of memory cells, a bit line is linked to the capacitors of the transistors of a column of memory cells and a word line is linked to the transistors of a column of memory cells to form a word column so that the voltage seen by the transistor can be controlled via the word column and the third line.

In one embodiment of the invention, each third line is equipped with a driver for providing a voltage on the third line. In another embodiment of the invention, the memory device comprises a predecoding module connected to the drivers for providing a voltage on the third lines. Advantageously, each driver may provide a first voltage or a second voltage on a third line.

In another embodiment of the invention, the memory device comprises a decoding module for controlling a plurality of word columns and a decoding module for controlling a plurality of bit lines. The device may comprise at least one blowable type capacitor.

The device may comprise multiplexing means provided with a module per bit line and evaluation means. The modules selectively link a memory cell to the evaluation means. The evaluation means outputs a logic level corresponding to the impedance of the memory cell selected.

The invention also provides a method of blowing a capacitor of a memory cell, wherein each memory cell comprises a capacitor and a transistor connected in series. The method comprises providing a high voltage $V_1$ on a terminal of the capacitor, an intermediate voltage $V_2$ on the gate of the transistor, and a low, zero or negative voltage $V_3$ on the source of the transistor. This is done while providing the high voltage $V_1$ on the terminals of the capacitors of the memory cells of the same column, and an intermediate voltage $V_4$ on the sources of the transistors of the other rows.

Thus, only the capacitor of the memory cell which one chooses to blow receives at its terminals a sizeable voltage, close to the difference $V_1-V_3$, while the elements of the other memory cells receive at their terminals voltages close to the normal operating voltage. Advantageously, the intermediate voltage $V_2$ is imposed on the gates of the transistors of the same column. In one embodiment of the invention, the voltages $V_2$ and $V_4$ are equal. We can have $V_3=0$ volts and $V_2$ and $V_4$ close to $V_1/2$. More precisely, provision may be made for $V_2$ and $V_4$ to lie between 40 and 60% of the value of $V_1$, and preferably between 50 and 60%. By way of example, $V_1$ may be equal to 6 volts, $V_2$ and $V_4$ may be equal to 3.3 volts and $V_3$ may be equal to 0 volts.

BRIEF DESCRIPTION OF THE DRAWINGS

The present invention will be better understood on studying the detailed description of a few embodiments taken by way of nonlimiting examples and illustrated by the appended drawings, in which:

FIGS. 4 and 5 are partial diagrams respectively illustrating the reading of a capacitor in the blown state and in the nonblown state according to the present invention.

DETAILED DESCRIPTION OF THE PREFERRED EMBODIMENTS

Figure 1:
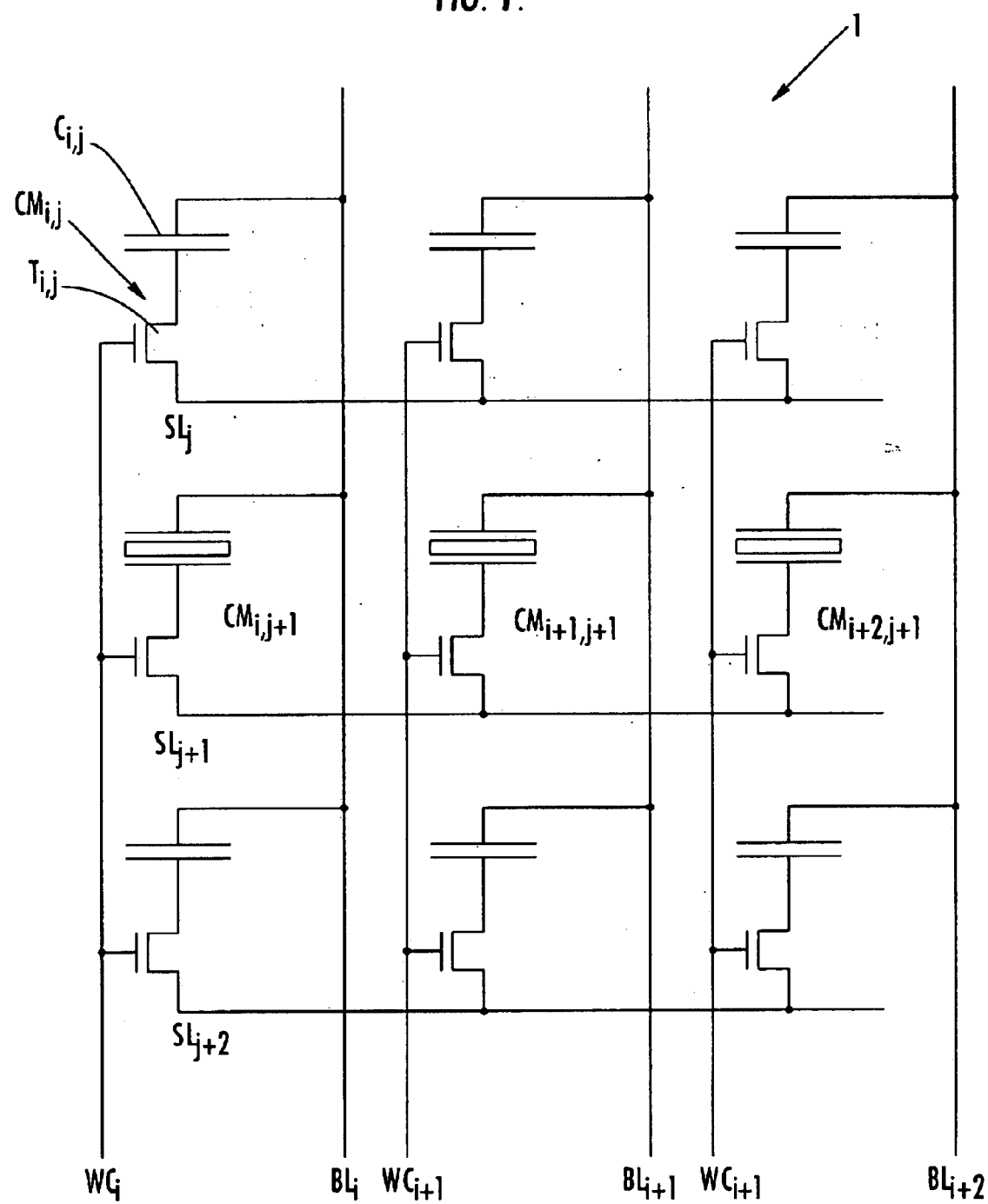
FIG. 1 is a block diagram of a memory device according to the present invention.

As illustrated in FIG. 1 a memory device is referenced 1 as a whole, but only a part of which has been illustrated. The memory device 1 comprises a plurality of memory cells CM arranged in rows and columns. The memory cell of column i and row j is denoted $CM_{i,j}$. Each memory cell CM is linked to a bit line BL arranged vertically in FIG. 1, and therefore serving the memory cells of a column.

Also provided are word columns WC that are arranged vertically and serving the memory cells CM of a column, source lines SL that are arranged horizontally and serving the memory cells CM of a row. Stated otherwise, the memory cell $CM_{i,j}$ of column i of row j is linked to the bit line $BL_i$, to the word column $WC_i$ and to the source line $SL_j$.

More precisely, the gate of the transistor $T_{i,j}$ of the memory cell $CM_{i,j}$ is linked to the word column $WC_i$ of the column to which the memory cell belongs, while the source of the transistor $T_{i,j}$ is linked to the source line $SL_j$ of the row to which the memory cell $CM_{i,j}$ belongs. The capacitor $C_{i,j}$ of the memory cell $CM_{i,j}$ is linked to the drain of the transistor T and to the bit line $BL_i$ of the column to which the memory cell $CM_{i,j}$ belongs.

In FIG. 1, the capacitors $CM_{i,j+1}$, $CM_{i+1,j+1}$ and $CM_{i+2,j+1}$ have already been blown and are represented in a particular manner with a rectangle between the two segments depicting the capacitor. The blowing of the capacitor $C_{i,j}$ of memory cell $CM_{i,j}$ is performed as follows. A high voltage $V_1$, for example 6 volts, is applied to the bit line $BL_i$. An intermediate voltage $V_2$ is applied to the word column $WC_i$, with $V_2$ equal to 3.3 volts, for example. The voltage $V_3$, for example zero, is applied to the source line $SL_j$. Furthermore, an intermediate voltage $V_4$, for example 3.3 volts, is applied to the source lines other than the source line $SL_j$, and a low or zero intermediate voltage is applied to the bit lines other than the line $BL_j$. A zero voltage is applied to the word columns other than the word column $WC_j$.

As a result, the transistor $T_{i,j}$ receives on its source a voltage $V_3$ which is sufficiently below the voltage which it receives on its gate to turn it on, so that the drain of the transistor $T_{i,j}$ is at a voltage close to the voltage $V_3$. The capacitor $C_{i,j}$ experiences a voltage close to the difference $V_1-V_3$ which is sufficient to blow it. The transistors of the same column, for example the transistor $T_{i,j+1}$, has a voltage between its gate and its source $V_{gs}=V_2-V_4$ which is almost zero. In any event, the voltage is such that the transistor $T_{i,j+1}$ is off. The voltage across the terminals of the memory cell $CM_{i,j+1}$ is equal to the difference $V_1-V_4$, for example, on the order of 2.7 volts. This voltage can be entirely withstood by the transistor $T_{i,j+1}$, or more generally, by one of the two elements forming the memory cell $CM_{i,j+1}$.

The memory cell $CM_{i+1,j}$ of the same row as the memory cell $CM_{i,j}$ which is blown receives the following voltages: a voltage $V_3$, for example zero, on the source line $SL_j$, a voltage which would generally be chosen to be zero on the word column $WC_{i+1}$, and a voltage which may likewise be chosen to be zero on the bit line $BL_{i+1}$. It is understood that there is no particular danger of damaging the memory cell $CM_{i+1,j}$ of the same row as the memory cell $CM_{i,j}$ in the course of blowing the memory cell. More generally, with the source line $SL_j$ being close to 0 volts, any voltage lying between 0 volts and the normal operating voltage, for example 3.3 volts, may be applied without damaging or providing any particular drawback to the word column $WC_{i+1}$ and to the bit line $BL_{i+1}$.

In the present architecture, a transistor of column i and of a row different from j during the blowing of the memory cell $CM_{i,j}$ experiences a voltage which is equal to the maximum between the voltage $V_2$ and the difference $V_1-V_2$. Specifically, the voltage between the gate and the drain is equal to $V_{gd}=V_1-V_2/V_{gs}$, with $V_{gs}=V_2$.

By way of example, with a voltage $V_1$ of 6 volts and a voltage $V_2$ and $V_4$ of 3.3 volts, a transistor T is able to withstand 3.3 volts maximum between its gate and source, its gate and drain and its gate and base, and can still operate. The transistor receives 3.3 volts maximum at its terminals and is not stressed or damaged, while in other architectures it would experience 6 volts and might be stressed or damaged. Hence, $V_1$ will be chosen to be sufficiently high to blow the capacitors while remaining less than twice the supply voltage of a standard MOS transistor.

Figure 2:
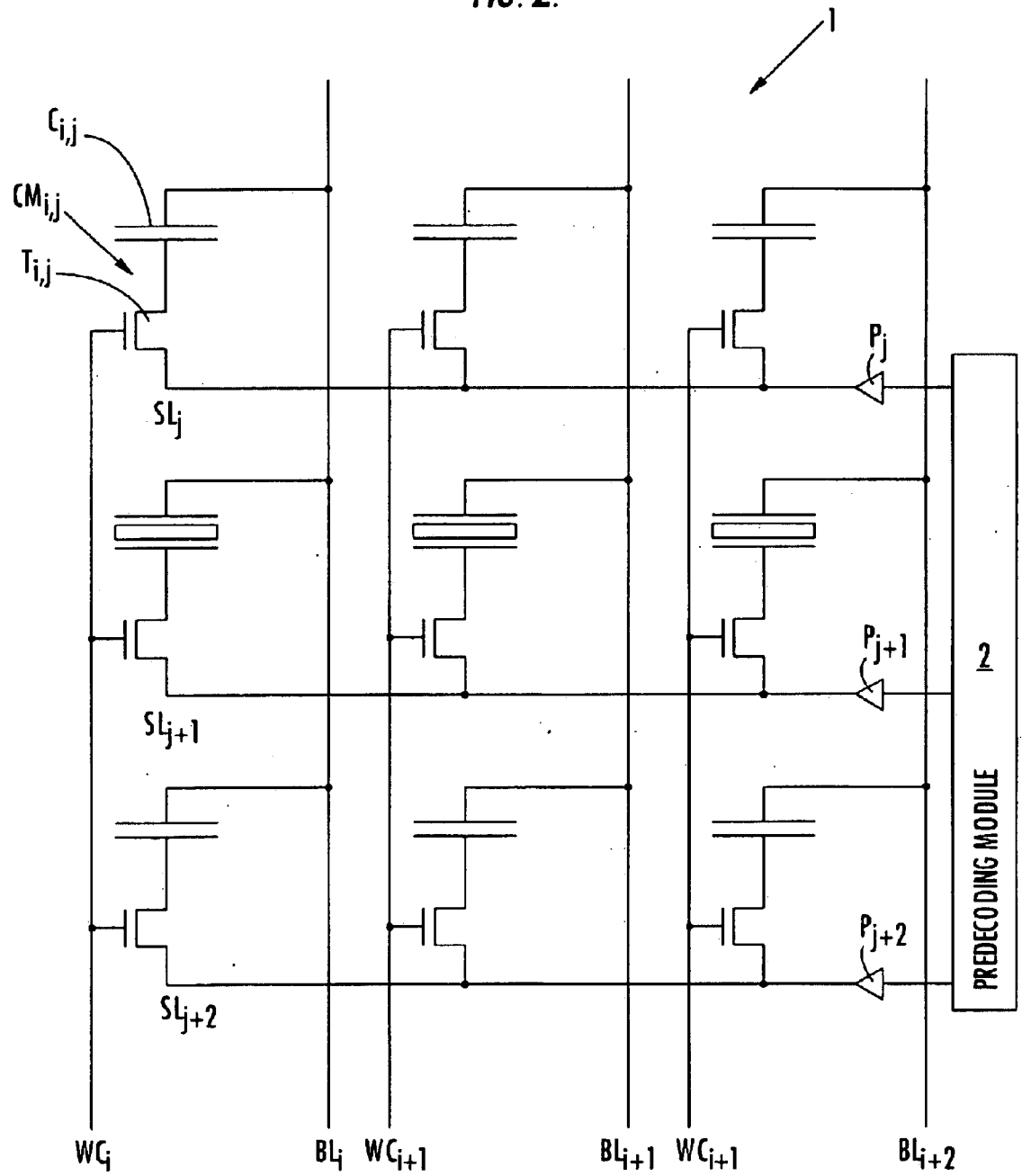
FIG. 2 is a more detailed block diagram according to the present invention in which the drivers and the decoding modules have been represented.

Represented in FIG. 2 are the drivers P of each source line SL. Driver $P_j$ linked to source line $SL_j$ is able to impose either the voltage $V_3$ or the voltage $V_4$ on the line $SL_j$, while providing the necessary current for obtaining the voltage. By way of example, driver $P_j$ will be able to impose a zero voltage or a voltage equal to 3.3 volts. A plurality of drivers P are linked to a predecoding module referenced 2, which makes it possible to generate the control commands required for the various drivers P on the basis of a control word received by the predecoding module 2 and originating from elements outside the memory. The predecoding module 2 may be of a conventional type.

By virtue of the invention, a memory architecture is made available which is very well tailored to blowable memories and allows them to be produced in numerous technologies, including overvoltage-sensitive MOS technologies. This does away with the need for MOS transistors which are very robust to overvoltages and which are generally more bulky and more expensive.

The reading of such a memory is performed by evaluating the impedance of the capacitor C which is different depending on whether it is intact or blown. For the reading of the memory cell $CM_{ij}$, it is possible to send a first reading voltage on the bit line $BL_i$, a second reading voltage on the word column $WC_i$, and a zero voltage or one close to zero on the source line $SL_j$ and another voltage, for example equal to the second reading voltage on the source lines of the other rows different from row j.

Figure 3:
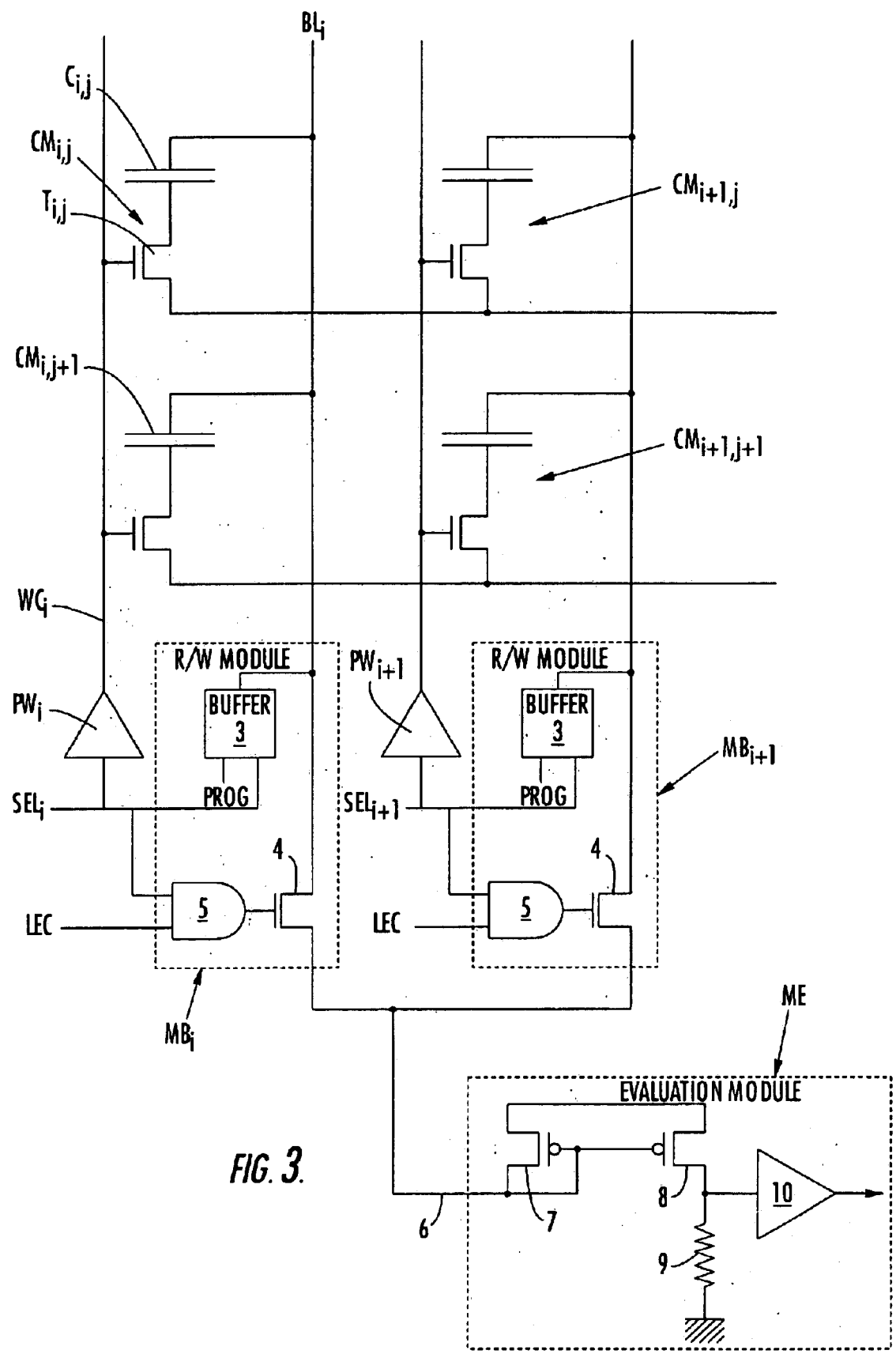
FIG. 3 is a diagram of means for reading the memory device according to the present invention.

A reading device embodiment is described with reference to FIG. 3 in which four memory cells $CM_{i,j}$, $CM_{i,j+1}$, $CM_{i+1,j}$, $CM_{i+1,j+1}$ have been represented. The end of each word line WC is linked to a driver PW. Each driver $PW_i$ is controlled by a selection line $Sel_i$. The drivers of the source lines SL have not been represented. The end of each bit line BL is linked to a read/write module MB. Several read/write modules MB are linked to an evaluation module ME.

The read/write module $MB_i$ comprises an element 3 of the three-stage buffer type. The output of the element 3 is linked to the bit line $BL_i$, and an input is linked to a programming line Prog and another input is linked to the selection line $Sel_i$. The read/write module $MB_i$ also comprises a MOS transistor 4 and an AND logic gate 5. The AND logic gate 5 includes an output linked to the gate of the transistor 4, an input linked to the selection line $Sel_i$ and another input linked to a read control line Lec. The transistor 4 is linked to the bit line $BL_i$ and to a line 6 common to several bit lines BL and linked to the input of the evaluation module ME.

The evaluation module ME comprises two MOS transistors 7 and 8, a resistor 9 and a driver 10. The gates of the two transistors 7 and 8 are linked to the line 6. The drains of the two transistors 7 and 8 are linked to a voltage source Vdd. The source of the transistor 7 is also linked to the line 6. The source of the transistor 8 is linked to the resistor 9, the other terminal of which is grounded, and to the input of the driver 10. The output of the driver 10 forms the output of the evaluation module ME.

The manner f operation is as follows. When the Prog line is at the logic value 0, the outputs of the elements 3 are an open circuit. That is, the lines BL are at a voltage independent of the corresponding lines $Sel_i$, reading is possible and writing is disabled. When the Prog line is at the logic value 1, the lines BL may be at 1 and programming access is possible, depending on the logic value of the line $Sel_i$. If $Sel_i$ is at the logic value 1 then the output of the element 3 of column i takes the logic value 1. Provision is made for the logic value 1 at the outputs of the elements 3 to be high, and in particular, equal to $V_1$. Thus, to blow a memory cell CM of column i, the lines Prog and $Sel_i$ are set to the 1 logic value level.

If Prog is at a logic value 1 and $Sel_i$ is at a logic value 0, then the output of the element 3 of column i is at the logic value 0 and imposes it on the line $BL_i$. When the line Lec is at the logic value 0, the gates of the transistors 4 are at the logic value 0, the transistors 4 are off and read access is disabled. When the line Lec is at the logic value 1, the gates of the transistors 4 may be at 1, the transistors 4 may be at 1 and read access is possible depending on the logic value of the line $Sel_i$ which will permit or disallow the reading of the memory cells of column i.

When Lec is at a logic value 1, a single line Sel may be at a logic value 1 at a given instant for a module ME. When $Sel_i$ is at a logic value 1 and Lec is at a logic value 1, the gate of the transistor 4 of the module $MB_i$ is at the logic value 1 and the transistor 4 is on. The driver $PW_i$ controlled by the line $Sel_i$ sends a voltage over the line $WC_i$ such that the transistors $T_i$ of the memory cells $CM_i$ may be on. Simultaneously, the source line $SL_j$ is set to a low or zero voltage and the other source lines $SL_j$ are set to a voltage on the order of $V_2$, so that the transistor $T_{i,j}$ is on and the other transistors $T_{i,j}$ of column i are off.

Thus, only the transistor $T_{i,j}$ is on and all the other transistors dependent on the same module ME are off. It follows that the current passing through the transistor $T_{i,j}$ is equal to the current passing through the transistor 4 of the module $MB_i$ and to the current flowing through the input of the module ME.

The capacitor C of the transistor $T_{i,j}$ exhibits an impedance $Z_c$ in the blown state and $Z_n$ in the normal, nonblown state. The manner of operation in the two states is represented in FIGS. 4 and 5. As described above, during reading, the transistor $T_{i,j}$ and the transistor 4 of the module $MD_i$ are on. To the impedance $Z_c$ there corresponds a current $I_c$ in the transistor 8 and the resistor 9, and a voltage $V_c$ at the point common to the transistor 8 and to the resistor 9. To the impedance $Z_n$ there corresponds a current $I_n$ in the transistor 8 and the resistor 9, and a voltage $V_n$ at the point common to the transistor 8 and to the resistor 9. The drive 10 then makes it possible to output voltage values at the levels required by the remainder of the circuit or of other circuits. The module ME makes it possible to read the impedance of the memory cells to which it is linked and to translate an impedance into a logic level.

Stated otherwise, the device comprises multiplexing means provided with a module per bit line and an evaluation means. The modules selectively link a memory cell to the evaluation means, and the evaluation means output a logic level corresponding to the impedance of the memory cell selected. A single evaluation means is associated with memory cells of a plurality of columns.

That which is claimed is:

1. A memory device comprising:
    a plurality of memory cells arranged in rows and columns, each memory cell comprising a transistor having a gate, a source and a drain, each memory cell also comprising a capacitor having a first terminal connected to the drain;
    a plurality of bit lines connected to the columns of memory cells, each bit line being connected to second terminals of said capacitors in a respective column of memory cells;
    a plurality of word lines connected to the columns of memory cells, each word line being connected to the gates of said transistors in a respective column of memory cells; and
    a plurality of third lines connected to the rows of memory cells, each third line being connected to the sources of said transistors in a respective row of memory cells.

2. A memory device according to claim 1, further comprising a plurality of drivers connected to said plurality of third lines for providing voltages thereto.

3. A memory device according to claim 2, further comprising a predecoding module connected to said plurality of drivers for control thereof.

4. A memory device according to claim 2, wherein each driver provides at least one of a first voltage and a second voltage to a respective third line.

5. A memory device according to claim 1, further comprising at least one decoding module connected to said plurality of word lines and to said plurality of bit lines.

6. A memory device according to claim 1, wherein a capacitor is blown based upon a voltage provide between the gate and the source of said transistor connected thereto.

7. A memory device according to claim 1, further comprising a multiplexer connected to said plurality of memory cells, said multiplexer comprising:
    an evaluator; and
    a plurality of read/write modules connected to said plurality of bit lines and to said evaluator for selectively connecting a memory cell thereto.

8. A memory device according to claim 7, wherein said evaluator output a logic level corresponding to an impedance of a selected memory cell.

9. A memory device comprising:
    a plurality memory cells arranged in rows and columns, each memory cell comprising a transistor having a control terminal and first and second conduction terminals, each memory cell also comprising a blowable capacitor having a first terminal connected to the second conduction terminal;
    a plurality of bit lines connected to the columns of memory cells, each bit line being connected to second terminals of said capacitors in a respective column of memory cells for providing a high voltage thereto;
    a plurality of word lines connected to the columns of memory cells, each word line being connected to the control terminals of said transistors in a respective column of memory cells for providing a first intermediate voltage thereto; and
    a plurality of third lines connected to the rows of memory cells, each third line being connected to the first conduction terminals of said transistors in a respective row of memory cells for providing a low voltage thereto for blowing a capacitor of a selected memory cell, and for providing a second intermediate voltage to the first conduction terminals of said transistors in the other rows of said memory cells;
    the low voltage being less than the high voltage, and the first and second intermediate voltages are between the low and high voltages.

10. A memory device according to claim 9, wherein a voltage between the gate and the source of each transistor is controlled via said word column and said third line connected thereto.

11. A memory device according to claim 9, wherein the first and second intermediate voltages are equal.

12. A memory device according to claim 9, wherein the low voltage is equal to at least one of a zero voltage and a negative voltage.

13. A memory device according to claim 9, further comprising a plurality of drivers connected to said plurality of third lines for providing the first and second intermediate voltages.

14. A memory device according to claim 13, further comprising predecoding module connected to said plurality of drivers for control thereof.

15. A memory device according to claim 9, further comprising a multiplexer connected to said plurality of memory cells, said multiplexer comprising:

an evaluator; and a plurality of read/write modules connected to said plurality of bit lines and to said evaluator for selectively connecting a memory cell thereto.

16. A memory device according to claim 15, wherein said evaluator outputs a logic level corresponding to an impedance of the selected memory cell.

17. A memory device comprising: a plurality of memory cells arranged in rows and columns, each memory cell comprising a transistor having a gate, a source and a drain, each memory cell also comprising a capacitor having a first terminal connected to the drain;

a plurality of bit lines connected to the columns of memory cells, each bit line being connected to second terminals of said capacitors in a respective column of memory cells;

a plurality of read/write modules connected to said plurality of bit lines for providing a high voltage thereto;

a plurality of word lines connected to the columns of memory cells, each word column being connected to the gates of said transistors in a respective column of memory cells;

a plurality of word column drivers connected to said plurality of word columns for providing a first intermediate voltage thereto;

a plurality of third lines connected to the rows of memory cells, each third line being connected to the sources of said transistors in respective row of memory cells; and a plurality of third line drivers connected to said plurality of third line for providing a low voltage thereto for blowing a capacitor of a selected memory cell and for providing a second intermediate voltage to the sources of said transistors in the other rows of said memory cells;

the low voltage being less than the high voltage, and the first and second intermediate voltages are between the low and high voltages.

18. A memory device according to claim 17, wherein a voltage between the gate and the source of each transistor is controlled via said word column driver and said third line driver connected thereto.

19. A memory device according to claim 17, further comprising a predecoding module connected said plurality of drivers for control thereof.

20. A memory device according claim 17, further comprising at least one decoding module connected to said plurality of word columns and to said plurality of bit lines.

21. A memory device according claim 17, further comprising an evaluator connected to said plurality of read/write modules, each memory cell being selectively connected to said evaluator via said plurality c read/write modules.

22. A memory device according claim 21, wherein said evaluator outputs a logic level corresponding to an impedance of a selected memory cell.

* * * * *

UNITED STATES PATENT AND TRADEMARK OFFICE
CERTIFICATE OF CORRECTION

PATENT NO. : 6,775,175 B2
DATED : August 10, 2004
INVENTOR(S) : Thomas

It is certified that error appears in the above-identified patent and that said Letters Patent is hereby corrected as shown below:

Column 4,
Line 27, delete "$CM_{ij}$" insert -- $CM_{i\,j}$ --
Line 62, delete "manner f operation" insert -- manner of operation --

Column 6,
Line 35, delete "plurality memory" insert -- plurality of memory --

Column 8,
Line 9, delete "line" insert -- lines --
Line 31, delete "plurality c read/write" insert -- plurality of read/write --

Signed and Sealed this

First Day of March, 2005

JON W. DUDAS
*Director of the United States Patent and Trademark Office*